United States Patent
Chou et al.

(10) Patent No.: US 9,236,294 B2
(45) Date of Patent: Jan. 12, 2016

(54) METHOD FOR FORMING SEMICONDUCTOR DEVICE STRUCTURE

(71) Applicant: Taiwan Semiconductor Manufacturing Co., Ltd, Hsin-Chu (TW)

(72) Inventors: Chia-Cheng Chou, Keelung (TW); Chung-Chi Ko, Jushan Jen (TW); Po-Cheng Shih, Hsinchu (TW); Chih-Hung Sun, Hsinchu (TW); Kuang-Yuan Hsu, Taichung (TW); Joung-Wei Liou, Zhudong Town (TW); Tze-Liang Lee, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 38 days.

(21) Appl. No.: 14/153,831

(22) Filed: Jan. 13, 2014

(65) Prior Publication Data

US 2015/0200133 A1    Jul. 16, 2015

(51) Int. Cl.
*H01L 21/00* (2006.01)
*H01L 21/768* (2006.01)
*H01L 21/02* (2006.01)

(52) U.S. Cl.
CPC .... *H01L 21/76868* (2013.01); *H01L 21/02351* (2013.01); *H01L 21/02354* (2013.01)

(58) Field of Classification Search
None
See application file for complete search history.

(56) References Cited

U.S. PATENT DOCUMENTS 7,141,499 B2 *  11/2006  Raaijmakers ............... 438/685
2011/0244677 A1 *  10/2011  Owada ........................ 438/653

* cited by examiner

*Primary Examiner* — Sonya D McCall Shepard
(74) *Attorney, Agent, or Firm* — Birch, Stewart, Kolasch & Birch, LLP

(57) ABSTRACT

Embodiments of the disclosure provide a method for forming a semiconductor device structure. The method includes forming a dielectric layer over a semiconductor substrate. The method also includes applying a carbon-containing material over the dielectric layer. The method further includes irradiating the dielectric layer and the carbon-containing material with a light to repair the dielectric layer, and the light has a wavelength greater than about 450 nm.

20 Claims, 7 Drawing Sheets

METHOD FOR FORMING SEMICONDUCTOR DEVICE STRUCTURE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while feature size (i.e., the smallest component that can be created using a fabrication process) has decreased. Such advances have increased the complexity of processing and manufacturing ICs. For these advances, similar developments in IC processing and manufacturing are developed.

As the density of semiconductor devices increases and the size of circuit elements becomes smaller, the resistance capacitance (RC) delay time increasingly dominates circuit performance. To reduce the RC delay, there is a desire to use low-k dielectrics. The low-k dielectrics are useful as inter-metal dielectrics (IMDs) and/or as interlayer dielectrics (ILDs).

However, the low-k dielectrics may present problems during processing. It is desirable to have improved manufacturing methods for forming reliable low-k dielectrics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
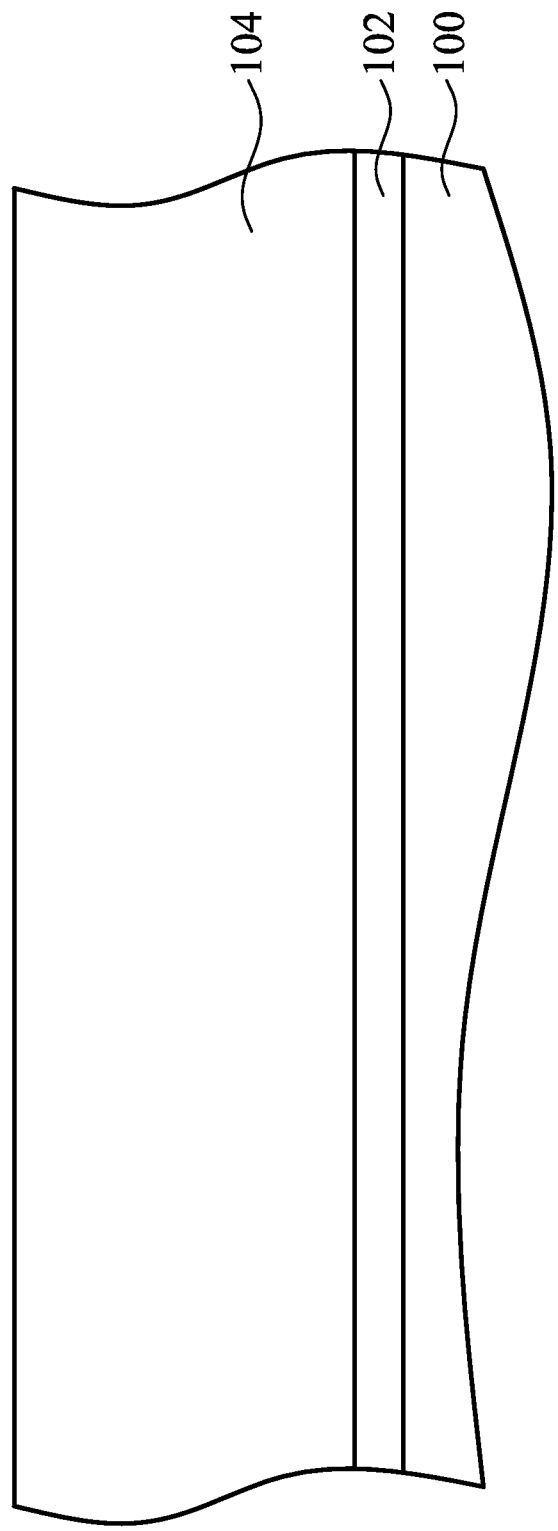
FIGS. 1A-1G are cross-sectional views of various stages of a process for forming a semiconductor device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the performance of a first process before a second process in the description that follows may include embodiments in which the second process is performed immediately after the first process, and may also include embodiments in which additional processes may be performed between the first and second processes. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1G are cross-sectional views of various stages of a process for forming a semiconductor device structure, in accordance with some embodiments. As shown in FIG. 1A, a semiconductor substrate 100 is provided. In some embodiments, the semiconductor substrate 100 is a semiconductor wafer (such as a silicon wafer) or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof.

As shown in FIG. 1A, an etch stop layer 102 is deposited over the semiconductor substrate 100, in accordance with some embodiments. The etch stop layer 102 is used for controlling the end point during subsequent etching processes. The etch stop layer 102 is made of, for example, a dielectric material. In some embodiments, the etch stop layer 102 is made of silicon nitride, silicon oxynitride, other suitable materials, or a combination thereof. In some embodiments, the etch stop layer is deposited using a chemical vapor deposition (CVD) process. For example, a low pressure chemical vapor deposition (LPCVD) process, a plasma enhanced chemical vapor deposition (PECVD) process, or other applicable deposition process is performed to form the etch stop layer 102. In some other embodiments, the etch stop layer 102 is not formed.

As shown in FIG. 1A, a dielectric layer 104 is deposited over the etch stop layer 102, in accordance with some embodiments. In some embodiments, the dielectric layer 104 is used as an interlevel dielectric (ILD) layer. In some embodiments, the dielectric layer 104 is used as an inter-metal dielectric (IMD) layer. In some embodiments, the dielectric layer 104 is a low-k dielectric layer. The low-k dielectric layer has a dielectric constant smaller than that of silicon dioxide. For example, the dielectric layer 104 has a dielectric constant in a range from about 1.5 to about 3.5. As the density of semiconductor devices increases and the size of circuit elements becomes smaller, the resistance capacitance (RC) delay time increasingly dominates circuit performance. Therefore, using a low-k dielectric material as the dielectric layer 104 is helpful for reducing the RC delay.

A wide variety of low-k material may be used for forming the dielectric layer 104. In some embodiments, the dielectric layer 104 includes a spin-on inorganic dielectric, a spin-on organic dielectric, a porous dielectric material, an organic polymer, an organic silica glass, SiOF serious material, a hydrogen silsesquioxane (HSQ) series material, a methyl silsesquioxane (MSQ) series material, a porous organic series material, other suitable materials, or a combination thereof.

In some embodiments, the dielectric layer 104 includes a material including Si, C, O, or H. For example, the dielectric layer 104 includes $SiO_2$, SiOC, SiON, SiCOH, SiOCN, or a combination thereof. In some embodiments, the dielectric layer 104 is made of carbon-doped silicon oxide. The carbon-doped silicon oxide may also be referred to as organosilicate glass (OSG) or C-oxide. In some embodiments, the carbon-doped silicon oxide includes of methyl silsesquioxane (MSQ), hydrogen silsesquioxane (HSQ), polysilsesquioxane, other suitable materials, or a combination thereof. In some embodiments, the dielectric layer 104 includes fluorine-doped silicate glass (FSG) such as fluorine-doped —(O—$Si(CH_3)_2$—O)—.

In some embodiments, the dielectric layer 104 also includes a class of low-k dielectrics called extreme low-k (ELK) dielectrics. The ELK dielectrics have a dielectric constant less than about 2, and they include porous dielectrics. In some embodiments, the dielectric layer 104 includes spin-on-glass (SOG), plasma enhanced (PE) tetraethoxysilane (TEOS), halogenated SiO, fluorinated silicate glass, other suitable materials, or a combination thereof.

In some embodiments, the dielectric layer 104 is a single layer or a multi-layered structure. In some embodiments, the dielectric layer 104 is deposited using a CVD process, such as PECVD process, LPCVD process, atomic layer deposition (ALD) process, other applicable deposition processes, or a combination thereof. Alternatively, the dielectric layer 104 is deposited using a spin-on process in some embodiments.

In some embodiments, the dielectric layer 104 is deposited using a PECVD process. One or more precursors are used for forming the dielectric layer 104. For example, the precursor includes tetramethylcyclotetrasiloxane (TMCTS), octamethylcyclotetrasiloxane (OMCTS), diethoxymethylsilane (DEMS), diethoxyldimethylsilane (DEDMS), other related cyclic or non-cyclic silanes and/or siloxanes, other suitable precursors, or a combination thereof. In some embodiments, the precursor is used in conjunction with an inert gas (such as He or Ar) and/or a reactant gas (such as $H_2O$, $O_2$, and/or $CO_2$). In some embodiments, a porogen is used to assist in the forming of the dielectric layer 104. In some embodiments, a curing process is performed to remove the porogen previously formed in the dielectric layer 104. The removing of the porogen results in the network of pores in the dielectric layer 104.

Figure 1B:
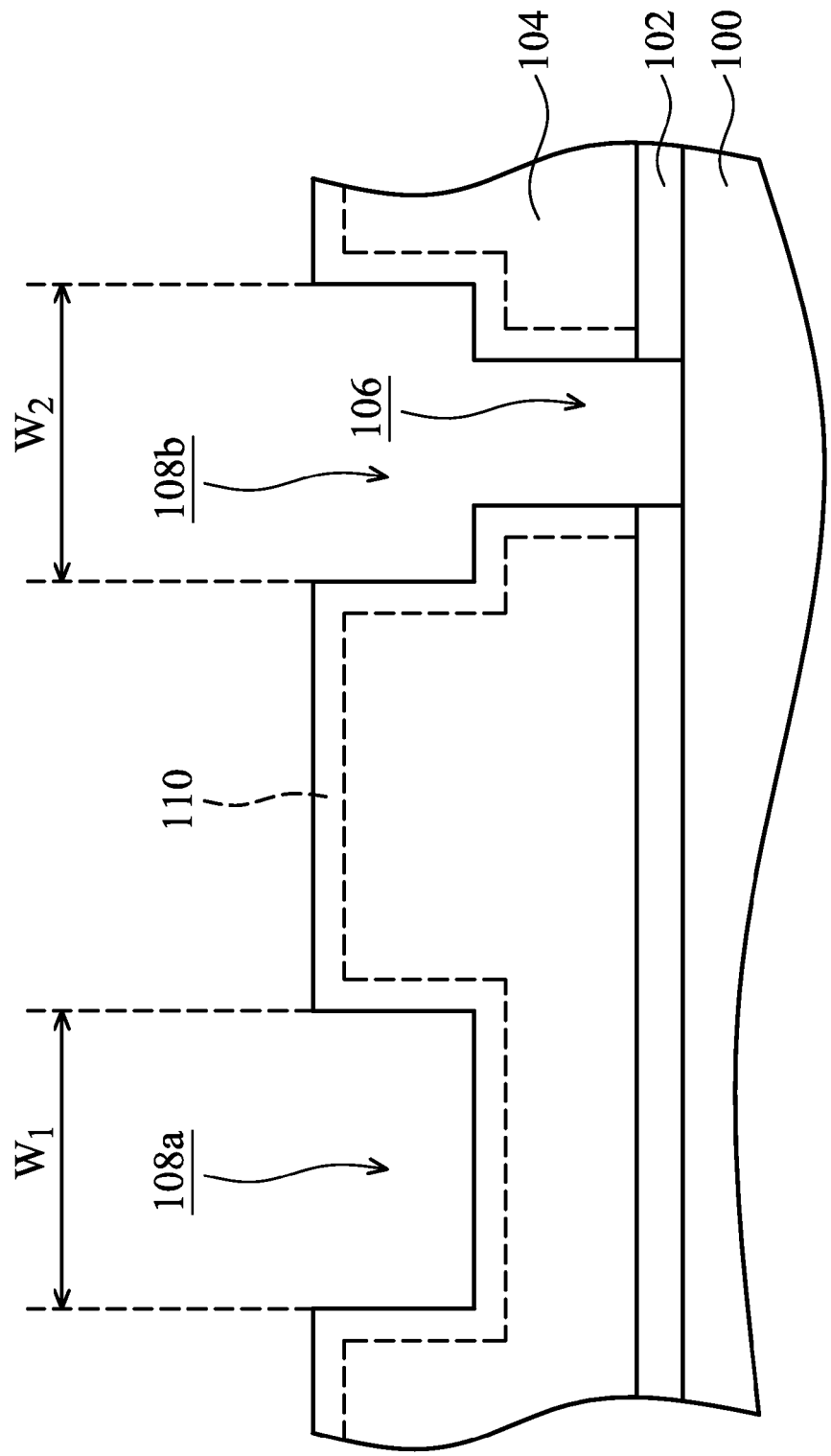

As shown in FIG. 1B, recesses are formed in the dielectric layer 104, in accordance with some embodiments. For example, recesses 108a, 108b, and 106 are formed in the dielectric layer 104, as shown in FIG. 1B. As shown in FIG. 1B, the recesses 108a and 108b have widths $W_1$ and $W_2$, respectively. In some embodiments, the recesses 108a and 108b are trenches, and the recess 106 is a via hole. In some embodiments, the recess 108b overlies and encompasses the recess 106 and together form a dual damascene structure. In some embodiments, the recess 108b (trench) encompasses one or more recesses (via holes). In some embodiments, the recesses 108b and 106 are formed in separate stacked dielectric layers.

In some embodiments, the dielectric layer 104 is partially removed to form the recesses. For example, photolithography and etching processes are used to form the recesses 106, 108a, and 108b. The etching process may include a dry etching process and/or a wet etching process. In some embodiments, plasma etch processes are used to form the recesses 106, 108a, and 108b. For example, plasma formed from hydrofluoric acid (HF) vapor is used to form the recesses 106, 108a, and 108b.

In some embodiments, a via-first process is used to form the recesses 106, 108a, and 108b. In some embodiments, a via mask (not shown) is formed over the dielectric layer 104. The via mask has openings where vias (including, for example, the recess 106) are subsequently etched. Afterwards, the recess 106 is partially etched down through a portion of the dielectric layer 104. The via mask is then stripped off and replaced with a line mask (not shown). A second etch operation is performed to remove a portion of the dielectric layer 104 to define line paths (including, for example, the recesses 108a and 108b. The etch operation also extends the recess 106 (the via hole) down to the etch stop layer 102. In some embodiments, the via mask and the line mask are patterned photoresist layers. In some embodiments, the via mask and the line mask are ashed away using a plasma formed from, for example, oxygen ($O_2$) gas and/or $CO_2$ gas. In some embodiments, another etching operation is performed to remove the exposed etch stop layer 102. In some embodiments, after the etching processes of the recesses are performed, a wet or dry clean process is performed.

It should be noted that the foregoing description is just an example of one via-first dual damascene process with which the embodiments may be implemented. In some other embodiments, a via-first process involves complete etching of the via holes (including the recess 106) prior to etching of the line trenches (including the recesses 108a and 108b). Alternatively, in some other embodiments, a trench-first process, in which the etching of the line trenches (including the recesses 108a and 108b) precedes the via etching is used. In some other embodiments, a single damascene processing is used. In some embodiments, a planarization process, such as a chemical mechanical polish (CMP) process, is performed to the dielectric layer 104 before the recesses are formed.

As mentioned above, a number of etching, ashing, cleaning, and/or planarization processes are performed to form the recesses in the dielectric layer 104. In some embodiments, the processes for forming the recesses damage the dielectric layer 104. The processes may introduce hydrogen and/or water into the dielectric layer 104 causing Si—OH groups to form, for example, which make the dielectric layer 104 hydrophilic. In some embodiments, upon exposure to a processing plasma, plasma damages the surface of the dielectric layer 104. In some embodiments, methyl group of the dielectric layer 104 is replaced with an OH group, thereby forming a silanol.

Studies shows that the silanol bonds at the surface of the dielectric layer 104 may degrade the integrity of the dielectric layer 104. One form of degradation is the increase in the dielectric constant of the dielectric layer 104 (the low-k dielectric material) due to the presence of silanol. The damaged dielectric layer 104 may become hydrophilic and adsorb moisture which increases the dielectric constant. In some embodiments, the processes for forming the recesses cause carbon depletion of the dielectric layer 104. The carbon concentration of the portion near the surface of the dielectric layer 104 is lowered, when compared with that before the recesses are formed.

As mentioned above, a damaged region 110 of the dielectric layer 104 may be formed due to the planarization, etching, ashing, and/or the cleaning processes, as shown in FIG. 1B. The damaged region 110 is, for example, a carbon depletion region. In some embodiments, the carbon depletion region has a thickness ranging from about 8 nm to about 12 nm. In some other embodiments, the carbon depletion region has a thickness ranging from about 1 nm to about 50 nm. The carbon concentration of the damaged region 110 is less than that of the lower portion (i.e., the portion below the damaged region 110) of the dielectric layer 104. The damaged region 110 has a dielectric constant higher than that of the lower portion of the dielectric layer 104. As a result, the overall dielectric constant of the dielectric layer 104 is increased. In some embodiments, the dielectric layer 104 is a porous dielectric layer, and pores in the damaged region 110 are filled with water, causing the dielectric constant of the dielectric layer 104 to increase significantly.

To reduce the RC delay, a repair process is performed to repair and/or restore the damaged region 110a of the dielectric layer 104, in accordance with some embodiments.

Figure 1C:
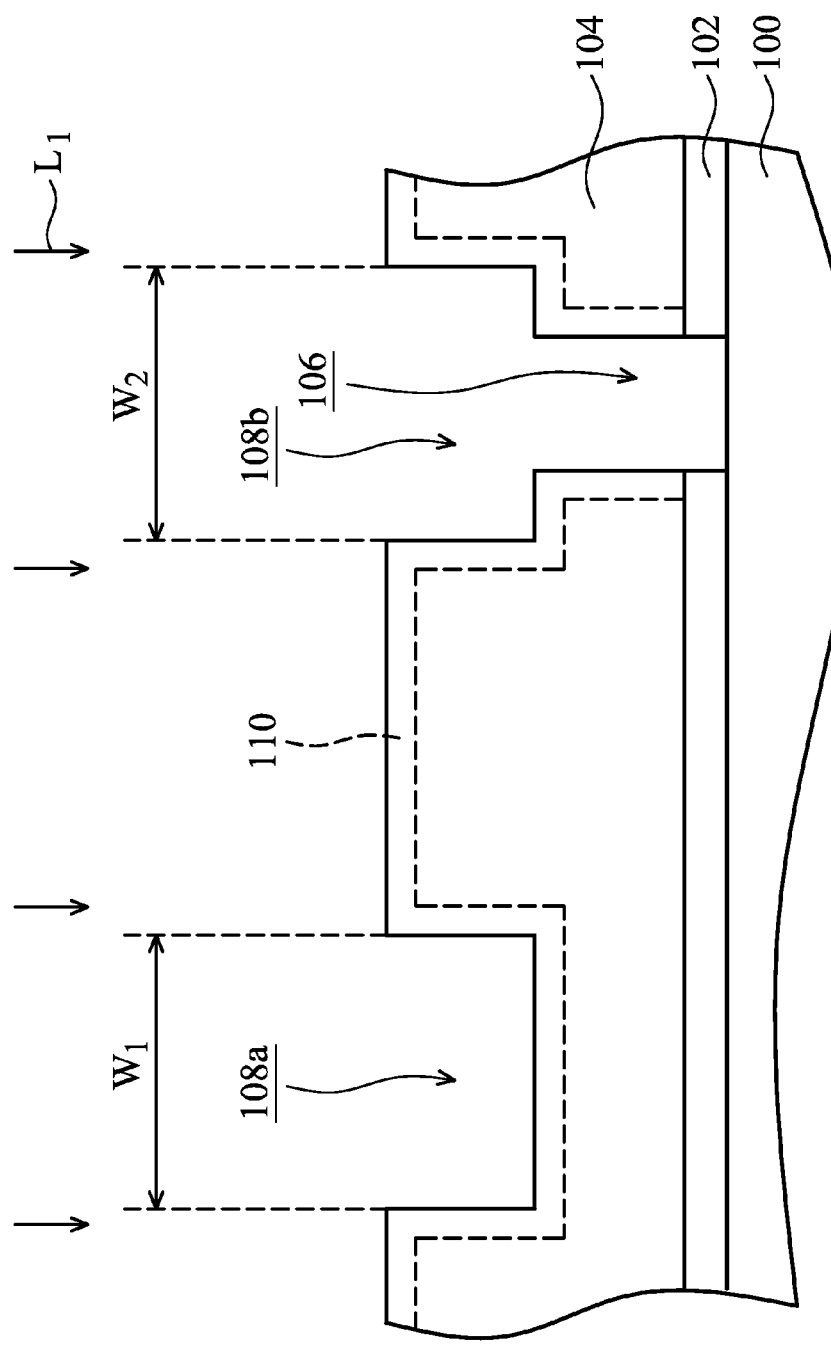

As shown in FIG. 1C, the dielectric layer 104 is irradiated with a light $L_1$, in accordance with some embodiments. In some embodiments, sidewalls and bottoms of the recesses 108a, 108b, and 106 are irradiated with the light $L_1$, as shown in FIG. 1C. The irradiation of the light $L_1$ is used to transform the surface condition of the dielectric layer 104 (or the damaged region 110) to assist in a subsequent repair process. For example, the irradiation of the light $L_1$ may assist in the removal of the moisture at the surface of the dielectric layer 104 (or the damaged region 110). The irradiation of the light $L_1$ may be used to substantially break some of silanol (Si—OH) bonds, some of Si—H bonds, and/or some of SiO—H bonds at the surface of the dielectric layer 104. Therefore, the surface of the dielectric layer 104 is in a better condition for being repaired and/or restored in a subsequent repair process. The dielectric layer 104 may be able to react with a subsequently applied repair material more easily.

In some embodiments, the light $L_1$ has a wavelength greater than about 450 nm. In some embodiments, the wavelength of the light $L_1$ is in a range from about 500 nm to about 3000 nm. In some embodiments, a light having a wavelength smaller than about 400 nm is prevented from being used as the light $L_1$. In some embodiments, the dielectric layer 104 is prevented from being irradiated with an ultraviolet (UV) light, which may cause the shrinkage of the dielectric layer 104. Because the dielectric layer 104 is irradiated with the light $L_1$ having a wavelength greater than about 450 nm, the dielectric layer is substantially not shrunk. The widths $W_1$ and $W_2$ of the recesses 108a and 108b are maintained substantially the same before and after being irradiated with the light $L_1$.

Embodiments of the disclosure have many variations and are not limited to the embodiments shown in FIG. 1C. In some other embodiments, the dielectric layer 104 is not irradiated with the light $L_1$ before the repair process. That is, the irradiation of the light $L_1$ may be optional.

Figure 1D:
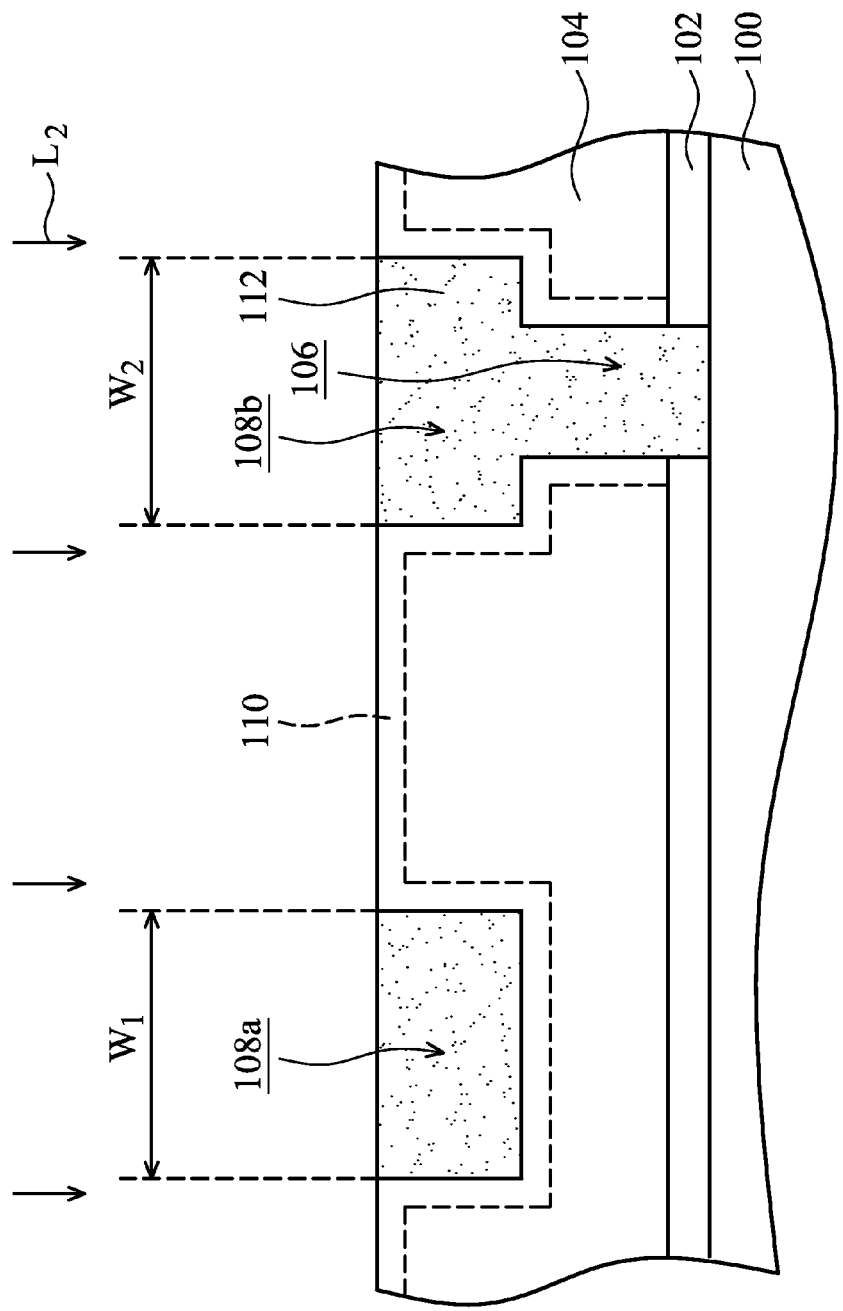

Afterwards, the repair process is performed to repair and/or restore the damaged region 110 of the dielectric layer 104. As shown in FIG. 1D, a repair material 112 is applied over the dielectric layer 104 for repairing the damaged region 110, in accordance with some embodiments. In some embodiments, the repair material 112 is applied directly on the damaged region 110 of the dielectric layer 104. In some embodiments, the repair material 112 is a carbon-containing material. In some embodiments, the repair material 112 includes a carbon-containing gas, a carbon-containing liquid, or a combination thereof. In some embodiments, the repair material 112 is applied over the damaged region 112 using a CVD process (such as a PECVD process), a spin-on process, other applicable processes, or a combination thereof.

In some embodiments, the repair material 112 includes a silylation compound, a hydrocarbon compound, other suitable compounds, or a combination thereof. The silylation compound may be in vapor phase and/or in liquid phase. In some embodiments, the silylation compound is introduced to contact with the damaged region 110 of the dielectric layer 104 to create, for example, Si—O—Si(CH$_3$)$_3$ groups in the dielectric layer 104. The Si—OH groups in the dielectric layer 104 may be converted into hydrophobic groups, such as Si—O—Si(CH$_3$)$_3$ groups. The hydrophobic groups have lower polarity and may assist in driving water out of the damaged region 110 of the dielectric layer 104. The carbon concentration of the damaged region 110 may be increased.

In some embodiments, the silylation compound is vaporized to allow the silylation compound to penetrate deeply into the dielectric layer 104. In some embodiments, the silylation compound of the repair material 112 includes dimethylaminotrimethylsilane (DMATMS, (CH$_3$)$_2$—N—Si—(CH$_3$)$_3$), bis(dimethylamino)dimethylsilane (BDMADMS), hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS, CH$_3$—Si—(OCH$_3$)$_3$), dimethyldimethoxysilane (DMDMS, (CH$_3$)$_2$—Si—(OCH$_3$)$_2$), methyltrimethoxysilane (MTMS, (CH$_3$)$_3$—Si—OCH$_3$), phenyltrimethoxysilane (PTMOS, C$_6$H$_5$—Si—(OCH$_3$)$_3$), phenyldimethylchlorosilane (PDMCS, C$_6$H$_5$—Si—(CH$_3$)$_2$—Cl), other compounds containing Si, H, and C, other suitable compounds, or a combination thereof.

In some embodiments, the hydrocarbon compound of the repair material 112 corresponds to the general formula $C_xH_y$. For example, the repair material 112 includes ethylene, acetylene, butadiene, alpha-terpinene (A-TRP), methane, bicycloheptadiene (BCHD), other suitable hydrocarbon compounds, or a combination thereof. In some embodiments, the repair material 112 includes super-critical CO$_2$ or the like. In some embodiments, the dielectric layer 104 is placed into a processing chamber containing carbon-containing plasma formed from the hydrocarbon compound. The hydrocarbon compound may repair and/or restore the damaged region 110 of the dielectric layer 104. The carbon concentration of the damaged region 110 may be increased. For example, the surface of the dielectric layer 104 may be converted into a less polar state and/or a hydrophobic state. It is easier to drive water out of the dielectric layer 104. Therefore, the dielectric constant of the dielectric layer 104 is lowered.

As mentioned above, the repair material 112 is used to repair and/or restore the damaged region 110 of the dielectric layer 104. However, in some embodiments, the reaction between the damaged region 110 and the repair compound 112 is slow or difficult to initiate. Therefore, it is desirable to accelerate and/or activate the repair reaction.

As shown in FIG. 1D, the dielectric layer 104 and the repair compound 112 are irradiated with a light $L_2$ to repair the dielectric layer 104, in accordance with some embodiments. The irradiation of the light $L_2$ is used to accelerate and/or activate the repair reaction between the repair compound 112 and the damaged region 110 of the dielectric layer 104. In some embodiments, the light $L_2$ has a wavelength greater than about 450 nm. For example, the wavelength of the light $L_2$ is in a range from about 500 nm to about 3000 nm. In some embodiments, the light $L_2$ is a visible light, an infrared (IR) light, or a combination thereof. In some embodiments, the dielectric layer 104 and the repair compound 112 are irradiated with the light $L_2$ for a suitable duration which is in a range from about 10 seconds to about 180 seconds.

The light $L_2$ is irradiated during the application of the repair material 112. In some embodiments, the light $L_2$ is irradiated after the application of the repair material 112. In some embodiments, the light $L_2$ is irradiated intermittently during the application of the repair material 112.

In some embodiments, the dielectric layer 104 is placed into a processing chamber (not shown). The repair material 112 is introduced into the processing chamber in conjunction with the irradiation of the light $L_2$. The light $L_2$ may activate and/or accelerate the reaction between the repair material 112 and the damaged region 110 of the dielectric layer 104. For example, the Si—OH groups in the dielectric layer 104 may be converted into hydrophobic groups, such as Si—O—Si (CH$_3$)$_3$ groups.

In some embodiments, the repair process mentioned above is performed at a room temperature. In some embodiments, the dielectric layer 104 is annealed during the irradiation of the light L$_2$. In some embodiments, the annealing temperature of the repair process is in a range from about 100 degrees C. to about 500 degrees C. In some other embodiments, the annealing temperature is in a range from about 200 degrees C. to about 400 degrees C.

In some embodiments, the light L$_2$ having a wavelength greater than 450 nm is sufficient to activate and/or accelerate the repair reaction between the repair material 112 and the damaged region 110 of the dielectric layer 104. In addition, the light L$_2$ does not have a too high energy to cause the dielectric layer 104 to be damaged and/or shrunk. For example, the light L$_2$ would not break the Si—O—Si bonds of the dielectric layer 104. In some embodiments, a UV light is prevented from being used as the light L$_2$ since studies show that the UV light may cause the shrinkage of the dielectric layer 104. Because the dielectric layer 104 is irradiated with the light L$_2$ having a wavelength greater than about 450 nm, the dielectric layer is substantially not shrunk. The widths W$_1$ and W$_2$ of the recesses 108a and 108b are maintained substantially the same before and after being irradiated with the light L$_2$.

Figure 1E:
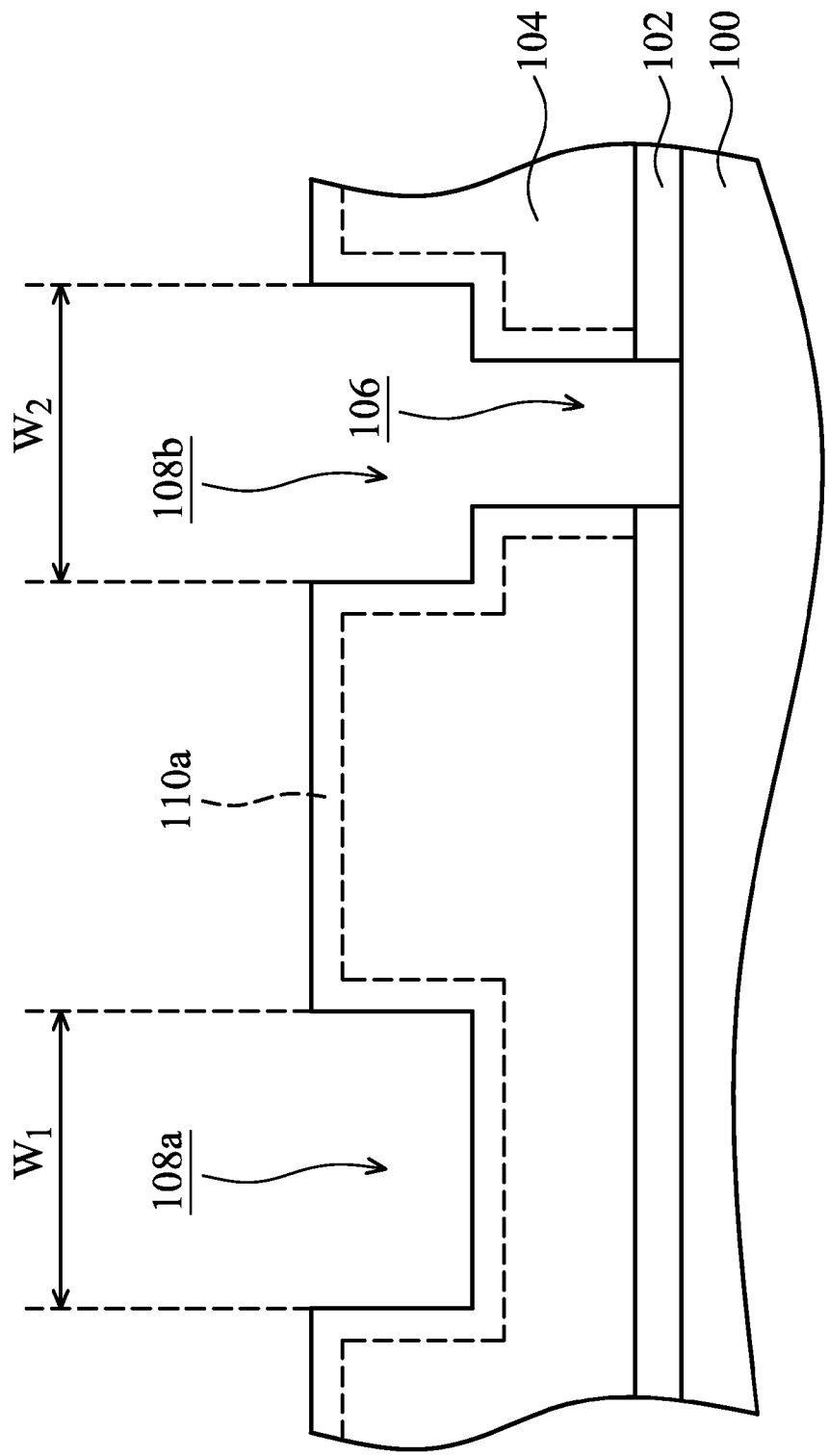

As shown in FIG. 1E, after the application of the repair material 112 and the irradiation of the light L$_2$, the damaged region 110 is repaired to be a repaired region 110a, in accordance with some embodiments. In some embodiments, the repaired region 110a has a carbon concentration greater than that of the damaged region 110 shown in FIG. 1B or 1C. In some embodiments, the carbon concentrations of the repaired region 110a and the lower portion (under the repaired region 110a) of the dielectric layer 104 are substantially the same. The dielectric constant of the repaired dielectric layer 104 is significantly reduced when compared to that of the dielectric layer 104 before being repaired. In some embodiments, the repair material 112 is removed, as shown in FIG. 1E.

Figure 1F:
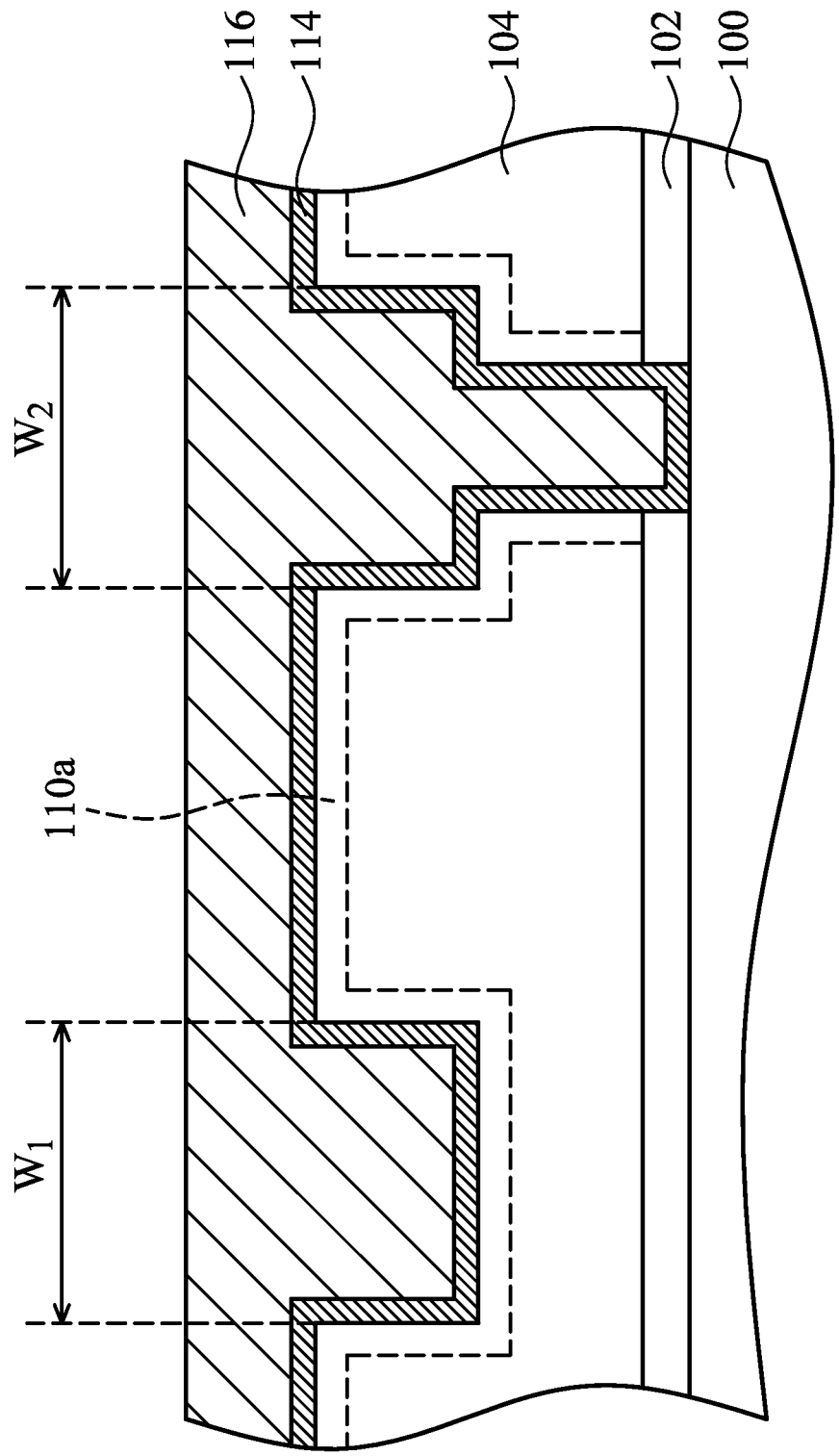

Afterwards, one or more conductive features are formed in the recesses in the repaired dielectric layer 104, in accordance with some embodiments. As shown in FIG. 1F, a diffusion barrier layer 114 is deposited over sidewalls and bottoms of the recesses, in accordance with some embodiments. The diffusion barrier layer 114 is used to prevent a subsequently formed conductive feature from diffusing into the dielectric layer 104. In some embodiments, the diffusion barrier layer 114 is made of Ti, Ta, TaN, TiN, WN, TbN, VN, ZrN, CrN, WC, WCN, NbN, AlN, other suitable materials, or a combination thereof. In some embodiments, the diffusion barrier layer 114 is deposited using a PVD process, a CVD process, other applicable processes, or a combination thereof. Embodiments of the disclosure have many variations. In some other embodiments, the diffusion barrier layer 114 is not formed.

As shown in FIG. 1F, a conductive material 116 is deposited over the diffusion barrier layer 114 to overfill the recesses in the dielectric layer 104, in accordance with some embodiments. A seed layer (not shown) may be deposited over the diffusion barrier layer 114 before the conductive material 116 is deposited. In some embodiments, the conductive material 116 includes copper, aluminum, tungsten, titanium, gold, platinum, other suitable conductive materials, or a combination thereof. In some embodiments, the conductive material 116 is deposited using an electroplating process, a CVD process, a PVD process, other applicable processes, or a combination thereof.

Figure 1G:
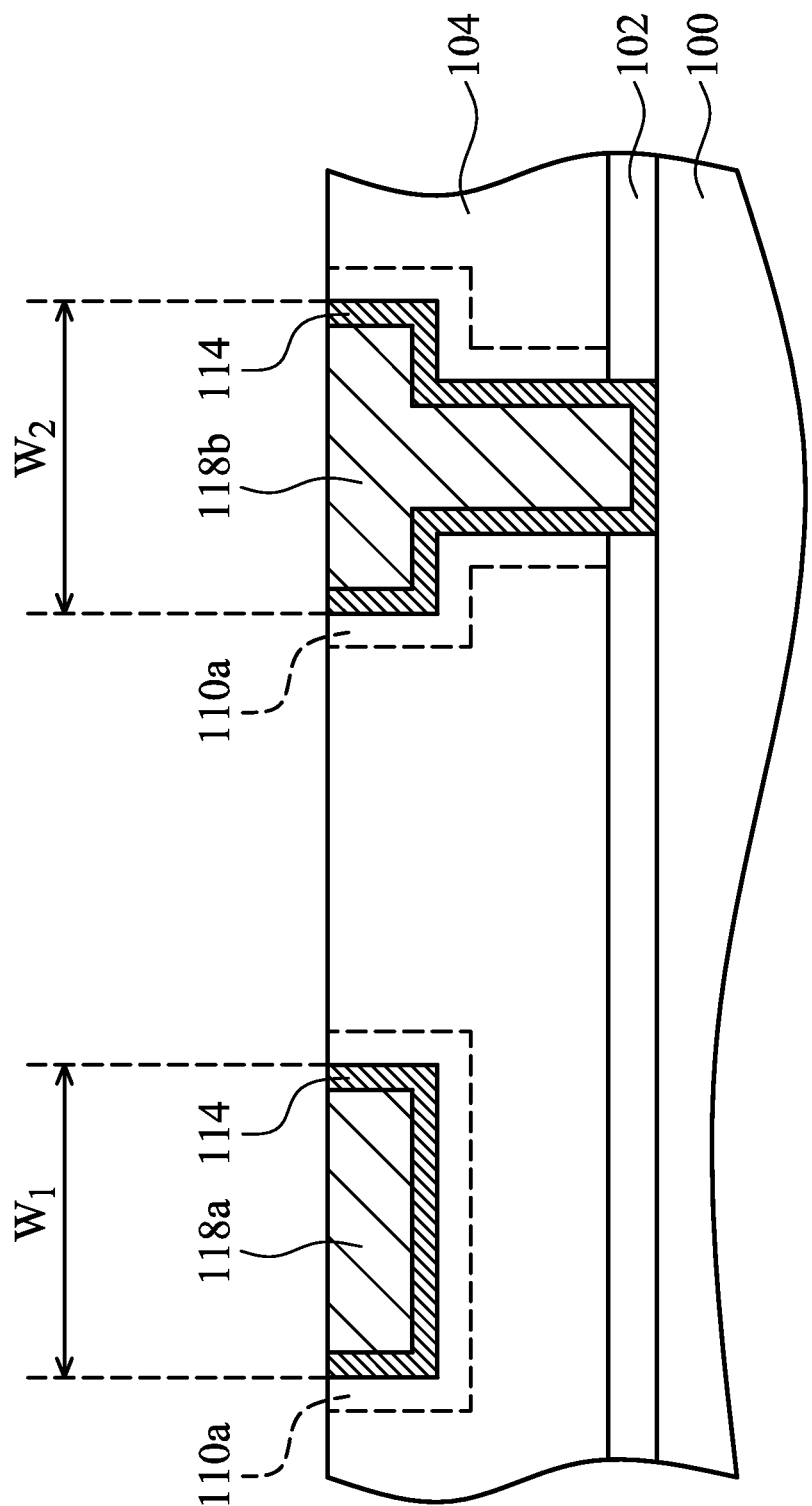

As shown in FIG. 1G, a planarization process is performed to remove the conductive material 116 outside of the recesses, in accordance with some embodiments. In some embodiments, conductive features 118a and 118b are formed in the dielectric layer 104, as shown in FIG. 1G. In some embodiments, the planarization process includes chemical mechanical polishing process, a grinding process, an etching process, other applicable processes, or a combination thereof. In some embodiments, the conductive features 118a and 118b are electrically connected to doped regions thereunder and/or other conductive features.

In some embodiments, the planarization process mentioned above damages the exposed surface of the dielectric layer 104. In some embodiments, another repair process similar to that illustrated in FIGS. 1C and 1D is performed to repair the dielectric layer 104. Therefore, the dielectric constant of the dielectric layer 104 may be maintained low. The RC delay may be significantly reduced.

Embodiments of the disclosure provide a repair process for repair and/or restore a damaged region (or a carbon depletion region) of a low-k dielectric layer. A carbon repair material is applied on the damaged region of the dielectric layer in conjunction with the irradiation of a light. The light is used to activate and/or accelerate the repair reaction between the repair material and the damaged region of the dielectric layer. The wavelength of the light is controlled such that the irradiated dielectric layer would not be shrunk. For example, the light has a wavelength greater than about 450 nm. Therefore, the profile of the dielectric layer maintains substantially the same. After the repair process, the carbon concentration of the damaged region may be increased to be similar to a lower portion of the dielectric layer. The dielectric constant of the repaired dielectric layer is lowered. The RC delay is significantly reduced. The reliability and quality of the dielectric layer are improved.

In accordance with some embodiments, a method for forming a semiconductor device structure is provided. The method includes forming a dielectric layer over a semiconductor substrate. The method also includes applying a carbon-containing material over the dielectric layer. The method further includes irradiating the dielectric layer and the carbon-containing material with a light to repair the dielectric layer, and the light has a wavelength greater than about 450 nm.

In accordance with some embodiments, a method for forming a semiconductor device structure is provided. The method includes forming a low-k dielectric layer over a semiconductor substrate. The method also includes partially removing the low-k dielectric layer to form a recess in the low-k dielectric layer. The method further includes applying a carbon-containing material over the low-k dielectric layer. In addition, the method includes irradiating the carbon-containing material and the low-k dielectric layer with a light to repair the low-k dielectric layer, and the light has a wavelength greater than about 450 nm.

In accordance with some embodiments, a method for forming a semiconductor device structure is provided. The method includes forming a dielectric layer over a semiconductor substrate. The method also includes applying a repair material over the dielectric layer. The method further includes irradiating the repair material and the dielectric layer with a light to repair the dielectric layer, and the light has a wavelength greater than about 450 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dielectric layer over a semiconductor substrate;
    applying a carbon-containing material over the dielectric layer; and
    irradiating the dielectric layer and the carbon-containing material with a light to repair the dielectric layer, wherein the light has a wavelength greater than about 450 nm.

2. The method for forming a semiconductor device structure as claimed in claim 1, wherein the dielectric layer comprises a carbon doped silicon oxide layer and has a dielectric constant in a range from about 1.5 to about 3.5.

3. The method for forming a semiconductor device structure as claimed in claim 1, wherein the light has a wavelength in a range from about 500 nm to about 3000 nm.

4. The method for forming a semiconductor device structure as claimed in claim 1, further comprising removing the carbon-containing material after the dielectric layer is repaired.

5. The method for forming a semiconductor device structure as claimed in claim 1, wherein the dielectric layer and the carbon-containing material are irradiated with the light during the application of the carbon-containing material.

6. The method for forming a semiconductor device structure as claimed in claim 1, wherein the carbon-containing material comprises a carbon-containing gas, a carboncontaining liquid, or a combination thereof.

7. The method for forming a semiconductor device structure as claimed in claim 1, further comprising forming a recess in the dielectric layer before the carbon-containing material is applied.

8. The method for forming a semiconductor device structure as claimed in claim 7, further comprising irradiating a sidewall and a bottom of the recess with a second light before the carbon containing material is applied, wherein the second light has a wavelength greater than about 450 nm.

9. The method for forming a semiconductor device structure as claimed in claim 7, wherein a first width and a second width of the recess before and after the irradiation of the light are substantially the same.

10. The method for forming a semiconductor device structure as claimed in claim 1, further comprising annealing the dielectric layer during the irradiation of the light.

11. The method for forming a semiconductor device structure as claimed in claim 1, further comprising forming a conductive feature in the recess after the dielectric layer is repaired.

12. A method for forming a semiconductor device structure, comprising:
    forming a low-k dielectric layer over a semiconductor substrate;
    partially removing the low-k dielectric layer to form a recess in the low-k dielectric layer;
    applying a carbon-containing material over the low-k dielectric layer; and
    irradiating the carbon-containing material and the low-k dielectric layer with a light to repair the low-k dielectric layer, wherein the light has a wavelength greater than about 450 nm.

13. The method for forming a semiconductor device structure as claimed in claim 12, wherein the low-k dielectric layer and the carbon-containing material are irradiated with the light during the application of the carbon-containing material.

14. The method for forming a semiconductor device structure as claimed in claim 12, wherein the light has a wavelength ranging from about 500 nm to about 3000 nm.

15. The method for forming a semiconductor device structure as claimed in claim 12, wherein the low-k dielectric layer is substantially not shrunk after being irradiated by the light.

16. The method for forming a semiconductor device structure as claimed in claim 12, further comprising irradiating the low-k dielectric layer with a second light before the carbon containing material is applied, wherein the second light has a wavelength greater than about 450 nm.

17. A method for forming a semiconductor device structure, comprising:
    forming a dielectric layer over a semiconductor substrate;
    applying a repair material over the dielectric layer; and
    irradiating the repair material and the dielectric layer with a light to repair the dielectric layer, wherein the light has a wavelength greater than about 450 nm.

18. The method for forming a semiconductor device structure as claimed in claim 17, wherein the repair material is a carbon-containing material.

19. The method for forming a semiconductor device structure as claimed in claim 17, further comprising etching the dielectric layer to form a recess in the dielectric layer before the repair material is applied.

20. The method for forming a semiconductor device structure as claimed in claim 19, further comprising irradiating the dielectric layer with a second light after the recess is formed and before the repair material is applied, wherein the second light has a wavelength greater than about 450 nm.

* * * * *